United States Patent [19]
Asano

[11] Patent Number: 5,963,786
[45] Date of Patent: Oct. 5, 1999

[54] METHOD OF MAKING SEMICONDUCTOR LASER WITH INVERTED MESA SHAPED RIDGE WITH CERVICAL SURFACE

[75] Inventor: Hideki Asano, Kanagawa-ken, Japan

[73] Assignee: Fuji Photo Film Co., Ltd., Kanagawa-ken, Japan

[21] Appl. No.: 09/009,726

[22] Filed: Jan. 21, 1998

Related U.S. Application Data

[62] Division of application No. 08/815,083, Mar. 11, 1997.

[30] Foreign Application Priority Data

Mar. 11, 1996 [JP] Japan .................................. 8-53134

[51] Int. Cl.$^6$ .................................................. H01L 21/20
[52] U.S. Cl. .................................. 438/40; 438/39; 438/41
[58] Field of Search ................................ 438/22, 39, 40, 438/41, 46, 47; 372/43, 44, 46

[56] References Cited

U.S. PATENT DOCUMENTS 4,496,403  1/1985  Turley .

*Primary Examiner*—Charles Bowers
*Assistant Examiner*—Keith Christianson
*Attorney, Agent, or Firm*—Sughrue, Mion, Zinn, Macpeak & Seas, PLLC

[57] ABSTRACT

A semiconductor laser has a first conduction type clad layer, an active layer and a second conduction type clad layer formed on a first conduction type semiconductor substrate in this order. An inverted mesa-shaped ridge is formed on a part of the second conduction type clad layer and a first conduction type current stopping layer is formed on each side of the ridge. Each side of the inverted mesa-shaped ridge is curved into a concave surface in a plane perpendicular to the longitudinal direction of the ridge.

6 Claims, 2 Drawing Sheets

METHOD OF MAKING SEMICONDUCTOR LASER WITH INVERTED MESA SHAPED RIDGE WITH CERVICAL SURFACE

This is a divisional of application Ser. No. 08/815,083 filed Mar. 11, 1997.

BACKGROUND OF THE INVENTION

1. Field of the Invention

This invention relates to a semiconductor laser, and more particularly to a semiconductor laser having an inverted mesa-shaped ridge on its upper surface and to a method of manufacturing such a semiconductor laser.

2. Description of the Related Art

There has been employed a semiconductor light emission device as a light source in information/image processing, communication, measurement, medicine and the like and there have been made various attempts to obtain a high power light beam of a single wavelength.

In a semiconductor laser having an oscillation wavelength of 0.6 to 1.1 $\mu$m, improving its beam quality is useful in increasing function of information/image processing. As a method of improving beam quality of a semiconductor laser, it has been proposed to control the laser to oscillate in a single transverse mode. Conventionally, in order to realize oscillation in a single transverse mode, a ridge is formed by etching a multi-layered semiconductor structure including an active layer (light emission layer) short of the active layer by use of an insulating film or the like as a mask and then a current stopping layer is formed by regrowth so that current is flowing only into a limited area.

The shape of the ridge is an important parameter which governs properties and production of devices. For example, when the ridge 8 is of a regular mesa shape (a trapezoid tapered outward) as shown in FIG. 3, the region of the semiconductor layer through which an electric current flows is narrower than the light emission region, which increases resistance of the device.

In order to avoid this problem, it is proposed to make the ridge 8 inverted mesa shaped as shown in FIG. 4, thereby reducing resistance of the device.

Though it is easy to form a ridge of an inverted mesa, a (111) crystal face is exposed on one side of the inverted mesa-shaped ridge when the ridge is formed by normal liquid etching. The (111) crystal face exposed on one side of the inverted mesa-shaped ridge makes it difficult to embed a semiconductor layer by regrowth. That is, it has been known that growth of crystal on a (111) face is very difficult and crystal hardly grows on the side of the ridge by a normal method of crystal growth, which makes it difficult to produce devices at high duplicability and high yield.

SUMMARY OF THE INVENTION

In view of the foregoing observations and description, the primary object of the present invention is to form an inverted mesa-shaped ridge without exposing a (111) crystal face on a side thereof, thereby facilitating growth of crystal on the ridge and providing single transverse mode semiconductor lasers at high yield.

The semiconductor laser in accordance with the present invention comprises a first conduction type clad layer, an active layer and a second conduction type clad layer formed on a first conduction type semiconductor substrate in this order, an inverted mesa-shaped ridge being formed on a part of the second conduction type clad layer and a first conduction type current stopping layer being formed on each side of the ridge, and is characterized in that each side of the inverted mesa-shaped ridge is curved into a concave surface in a plane perpendicular to the longitudinal direction of the ridge.

It should be noted that terms "first conduction type" and "second conduction type" are used for distinguishing an n-type conductive structure and a p-type conductive structure from each other in this specification. For example, when the first conduction type is n-type, the second conduction type is p-type and vice versa.

It is preferred that the first conduction type semiconductor substrate be of semiconductor of the group III to V element compounds, and the first conduction type current stopping layer be formed of semi-insulating semiconductor.

The method of producing a semiconductor laser in accordance with the present invention comprises the steps of forming at least a first conduction type clad layer, an active layer and a second conduction type clad layer on a first conduction type semiconductor substrate in this order, selectively forming insulating film in a striped pattern on the second conduction type clad layer, forming an inverted mesa-shaped ridge by etching a part of the second conduction type clad layer using the insulating film as a mask and forming a first conduction type current stopping layer on each side of the ridge, and is characterized by the step of curving each side of the inverted mesa-shaped ridge into a concave surface in a plane perpendicular to the longitudinal direction of the ridge.

It is preferred that semiconductor of the group III to V element compounds be used as the first conduction type semiconductor substrate, and the first conduction type current stopping layer be formed of semi-insulating semiconductor.

When the second conduction type clad layer is formed of a semiconductor compound selected from a group consisting of InGaP, AlGaInP and GaP, it is preferred that the second conduction type clad layer be etched with a mixture of hydrochloric acid and at least one kind of acid other than hydrochloric acid. Preferably the acid other than hydrochloric acid is acetic acid or phosphoric acid.

That is, in accordance with the present invention, by curving opposite sides of the inverted mesa-shaped ridge into a concave surface in a plane perpendicular to the longitudinal direction of the ridge, random crystal face orientations are provided on opposite sides of the ridge and exposure of a (111) crystal face is prevented, whereby regrowth of crystal is facilitated.

Further when the second conduction type clad layer is formed of a semiconductor compound selected from a group consisting of InGaP, AlGaInP and GaP, an inverted mesa-shaped ridge curved into a concave surface can be formed by etching the second conduction type clad layer with a mixture of hydrochloric acid and acetic acid or phosphoric acid.

Thus in accordance with the present invention, single transverse mode semiconductor lasers can be produced at high yield.

DESCRIPTION OF THE PREFERRED EMBODIMENT

Figure 1:
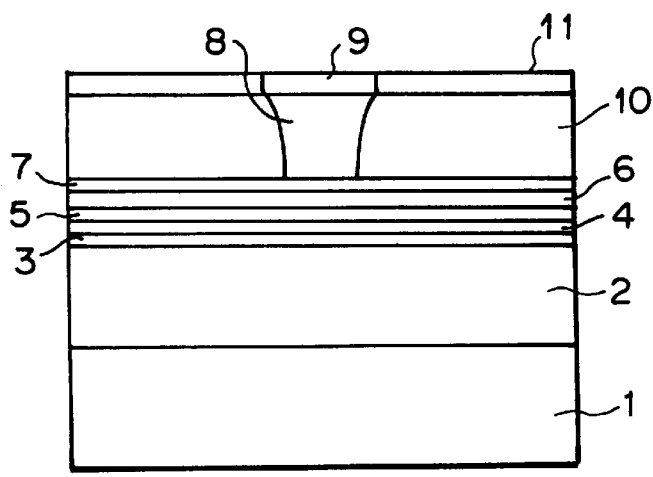
FIG. 1 is a schematic cross-sectional view showing the layer structure of a semiconductor laser in accordance with an embodiment of the present invention.
Figure 2A:
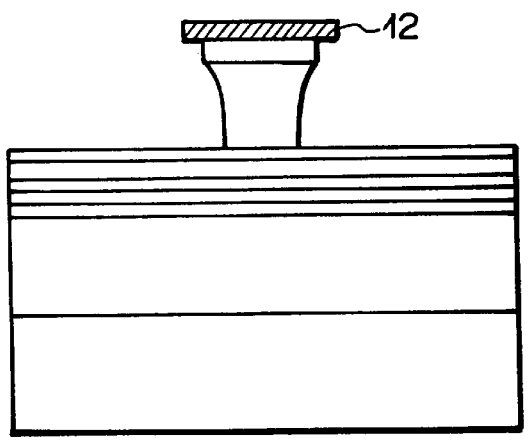
FIGS. 2A and 2B are schematic views for illustrating the procedure of crystal growth and selective etching in production of the semiconductor laser.
Figure 2B:
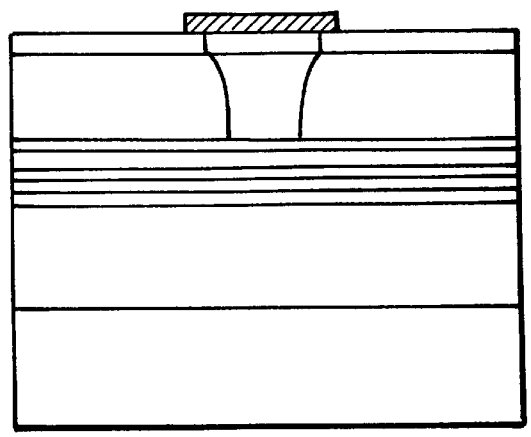
Figure 3:
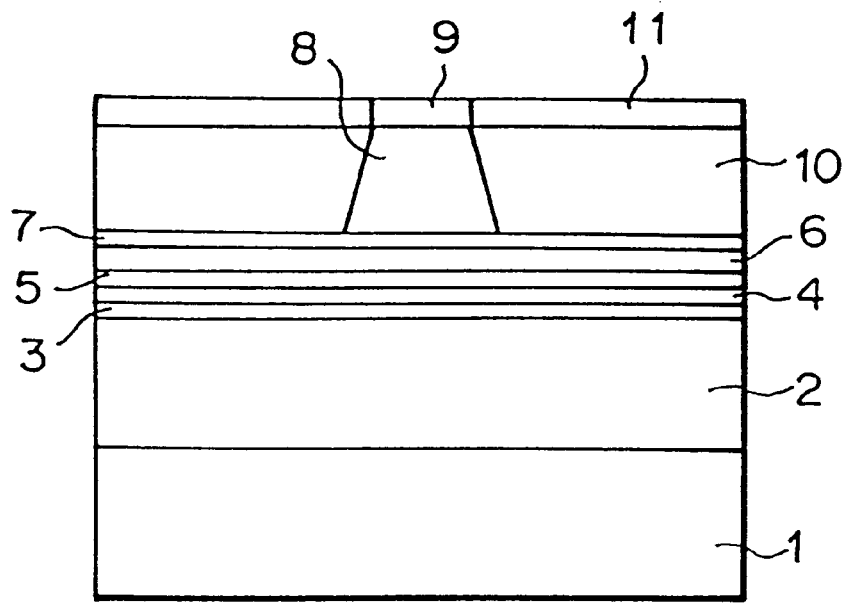
FIG. 3 is a schematic cross-sectional view of a conventional semiconductor laser having a mesa-shaped ridge clad layer.
Figure 4:
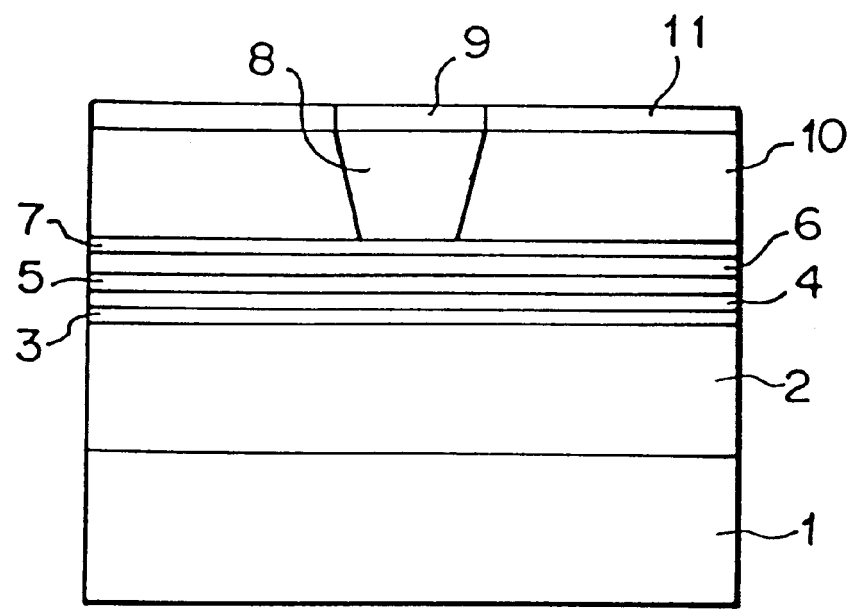
FIG. 4 is a schematic cross-sectional view of a conventional semiconductor laser having an inverted mesa-shaped ridge clad layer.

FIG. 1 shows the layer structure of a semiconductor laser in accordance with an embodiment of the present invention and FIGS. 2A and 2B show the producing procedure of the same.

An n-InGaP clad layer 2, a GaAs barrier layer 3, an InGaAs well layer 4, a GaAs barrier layer 5, a p-InGaP clad layer 6, a p-GaAs etching stop layer 7, a p-InGaP clad layer 8 and a p-GaAs capping layer 9 are first grown on an n-GaAs (100) substrate 1. In this particular embodiment, the first conduction type is n-type and the second conduction type is p-type.

Then insulating film 12 of $SiO_2$ is selectively formed on the p-GaAs capping layer 9 in a pattern of stripes oriented in parallel to (011) direction. Then the p-GaAs capping layer 9 and the p-InGaP clad layer 8 are selectively etched in sequence using the insulating film 12 as a mask. (FIG. 2A) The p-GaAs capping layer 9 is etched with nitric acid and the p-InGaP clad layer 8 is etched with 1:1 mixture (in mol ratio) of hydrochloric acid and acetic acid. The acid mixture selectively etches only InGaP, thereby forming an inverted mesa-shaped ridge and curving opposite sides of the ridge into a concave surface in a plane perpendicular to the longitudinal direction of the ridge.

Then an n-InGaP current stopping layer 10 and a p-GaAs capping layer 11 are grown (FIG. 2B) and the insulating film 12 is removed. Then an electrode is formed on each of the n-side and p-side, thereby forming a semiconductor laser.

Thus in this embodiment, by etching the InGaP clad layer 8 with a mixture of hydrochloric acid and acetic acid, an inverted mesa-shaped ridge having curved concave surfaces on opposite sides thereof is formed without exposing (111) crystal face.

The multi-layered semiconductor structure on the substrate 1 shown in FIGS. 2A and 2B may comprise an n-AlGaInP clad layer 2, an AlGaInP barrier layer 3, an InGaP well layer 4, an AlGaInP barrier layer 5, a p-AlGaInP clad layer 6, a p-GaAs etching stop layer 7, a p-AlGaInP clad layer 8 and p-GaAs capping layer 9. In this case, SiNx is employed as the insulating film 12, the p-GaAs capping layer 9 is etched with nitric acid and the p-AlGaInP clad layer 8 is etched with 1:1 mixture (in mol ratio) of hydrochloric acid and phosphoric acid. The acid mixture selectively etches only AlGaInP, thereby forming an inverted mesa-shaped ridge and curving opposite sides of the ridge into a concave surface in a plane perpendicular to the longitudinal direction of the ridge. As the current stopping layer 10 and the capping layer 11, n-GaAs and p-GaAs are employed.

In this case, by etching the p-AlGaInP clad layer 8 with a mixture of hydrochloric acid and phosphoric acid, an inverted mesa-shaped ridge having curved concave surfaces on opposite sides thereof is formed without exposing (111) crystal face.

In the semiconductor laser of the present invention, by curving opposite sides of the inverted mesa-shaped ridge into a concave surface in a plane perpendicular to the longitudinal direction of the ridge, random crystal face orientations are provided on opposite sides of the ridge and exposure of a (111) crystal face is prevented, whereby regrowth of crystal is facilitated.

What is claimed is:

1. A method of producing a semiconductor laser comprising the steps of forming at least a first conduction type clad layer, an active layer and a second conduction type clad layer on a first conduction type semiconductor substrate in this order, selectively forming insulating film in a striped pattern on the second conduction type clad layer, forming an inverted mesa-shaped ridge by etching a part of the second conduction type clad layer using the insulating film as a mask and forming a first conduction type current stopping layer on each side of the ridge, wherein the improvement comprising the step of curving each side of the inverted mesa-shaped ridge into a concave surface in a plane perpendicular to the longitudinal direction of the ridge.

2. A method of producing a semiconductor laser as defined in claim 1 in which a semiconductor substrate of the group III to V element compounds is employed as the first conduction type semiconductor substrate.

3. A method of producing a semiconductor laser as defined in claim 1 or 2 in which the first conduction type current stopping layer is formed of semi-insulating semi-conductor.

4. A method of producing a semiconductor laser as defined in claim 1 in which the second conduction type clad layer is formed of a semiconductor compound selected from a group consisting of InGaP, AlGaInP and GaP, and the second conduction type clad layer is etched with a mixture of hydrochloric acid and at least one kind of acid other than hydrochloric acid.

5. A method of producing a semiconductor laser as defined in claim 4 in which the acid other than hydrochloric acid is acetic acid.

6. A method of producing a semiconductor laser as defined in claim 4 in which the acid other than hydrochloric acid is phosphoric acid.

* * * * *